United States Patent
Cox et al.

(10) Patent No.: US 11,870,428 B1
(45) Date of Patent: Jan. 9, 2024

(54) SYSTEM AND METHOD FOR PULSED GATE CONTROL OF A TRANSISTOR

(71) Applicant: Infineon Technologies Austria AG, Villach (AT)

(72) Inventors: David Grant Cox, Rosegg (AT); Aliaksandr Subotski, Villach (AT); Jorge Arturo Ramirez Rivero, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/896,183

(22) Filed: Aug. 26, 2022

(51) Int. Cl.
*H03K 17/042* (2006.01)
*H03K 17/082* (2006.01)
*G01R 19/165* (2006.01)

(52) U.S. Cl.
CPC ....... *H03K 17/0822* (2013.01); *G01R 19/165* (2013.01)

(58) Field of Classification Search
CPC .......... H03K 17/042; H03K 17/04206; H03K 17/06; H03K 17/063; H03K 17/082; H03K 17/0822; H03K 17/12; H03K 17/122; G01R 19/165; G01R 19/16504; G01R 19/16519; G01R 19/16566; G01R 19/16571; G01R 19/16576; G01R 19/1659
See application file for complete search history.

(56) References Cited

U.S. PATENT DOCUMENTS

| | | | |
|---|---|---|---|
| 10,418,805 B2 * | 9/2019 | Simonson | H02H 9/004 |
| 10,720,768 B2 * | 7/2020 | Asanza Maldonado | H02H 1/04 |
| 2018/0102774 A1 | 4/2018 | Leong et al. | |

* cited by examiner

*Primary Examiner* — Long Nguyen
(74) *Attorney, Agent, or Firm* — COOPER LEGAL GROUP LLC (57) ABSTRACT

A method of controlling current through a transistor is provided. A voltage and current through the transistor are measured. A safe operating current for the voltage is determined. For each of a first sequence of current pulses, a voltage of a voltage pulse applied to a control node of the transistor using a feedback controller is adjusted until the current measured through the transistor is not greater than a first function of the safe operating current. For each of a second sequence of current pulses after the first sequence of current pulses, the voltage of the voltage pulse applied to the control node of the transistor using the feedback controller is adjusted until the current measured through the transistor is not greater than a second function of the safe operating current.

20 Claims, 6 Drawing Sheets

| $V_{DS}$ | $I_D$ |
|---|---|
| 1 | 142.474 |
| 2 | 114.7095 |
| 3 | 59.57816 |
| 4 | 33.51272 |
| 5 | 21.44814 |
| 6 | 14.89454 |
| 7 | 10.94293 |
| 8 | 8.378179 |
| 9 | 6.619796 |
| 10 | 5.362035 |
| 11 | 4.431434 |
| 12 | 3.723635 |
| 13 | 3.172802 |
| 14 | 2.735732 |
| 15 | 2.383127 |
| 16 | 2.094545 |
| 17 | 1.855375 |
| 18 | 1.654949 |
| 19 | 1.485328 |
| 20 | 1.340509 |
| 21 | 1.215881 |
| 22 | 1.107858 |
| 23 | 1.013617 |
| 24 | 0.930909 |
| 25 | 0.857926 |
| 26 | 0.7932 |
| 27 | 0.735533 |
| 28 | 0.683933 |
| 29 | 0.637578 |
| 30 | 0.595782 |

| $V_{DS}$ | $I_D$ |
|---|---|
| 31 | 0.557964 |
| 32 | 0.523636 |
| 33 | 0.492382 |
| 34 | 0.463844 |
| 35 | 0.437717 |
| 36 | 0.413737 |
| 37 | 0.391675 |
| 38 | 0.371332 |
| 39 | 0.352534 |
| 40 | 0.335127 |
| 41 | 0.318979 |
| 42 | 0.30397 |
| 43 | 0.289996 |
| 44 | 0.276965 |
| 45 | 0.264792 |
| 46 | 0.253404 |
| 47 | 0.242736 |
| 48 | 0.232727 |
| 49 | 0.223325 |
| 50 | 0.214481 |
| 51 | 0.206153 |
| 52 | 0.1983 |
| 53 | 0.190868 |
| 54 | 0.183883 |
| 55 | 0.177257 |
| 56 | 0.170983 |
| 57 | 0.165036 |
| 58 | 0.159395 |
| 59 | 0.154037 |
| 60 | 0.148945 |

| $V_{DS}$ | $I_D$ |
|---|---|
| 61 | 0.144102 |
| 62 | 0.139491 |
| 63 | 0.135098 |
| 64 | 0.130909 |
| 65 | 0.126912 |
| 66 | 0.123095 |
| 67 | 0.119448 |
| 68 | 0.115961 |
| 69 | 0.112624 |
| 70 | 0.109429 |
| 71 | 0.106368 |
| 72 | 0.103434 |
| 73 | 0.10062 |
| 74 | 9.79E-02 |
| 75 | 9.53E-02 |
| 76 | 9.28E-02 |
| 77 | 9.04E-02 |
| 78 | 8.81E-02 |
| 79 | 8.59E-02 |
| 80 | 8.38E-02 |

FIG. 6

SYSTEM AND METHOD FOR PULSED GATE CONTROL OF A TRANSISTOR

TECHNICAL FIELD

The present disclosure relates to an electronic circuit, and, in particular embodiments, to a system and method for pulsed gate control of a transistor.

BACKGROUND

Protection integrated circuits can be used as hot swap controllers, e-fuse controllers, or other types of controllers. A hot swap controller can be used to repair a working system or change the configuration of a system without interrupting the operation of the system. To this end, various components or peripherals of the system may be configured to be hot-swappable. These components or peripherals may be removed and installed while the rest of the system is still operational. This may occur, for example, in systems such as large computer servers or cloud storage systems that need to remain operational even during times when the system needs to be maintenance or repaired.

Hot-swappable components are configured to be inserted and removed in fully operational systems in which power is applied. In order to support the ability to insert and remove these components from a live power supply, each hot-swappable component typically includes power supply protection circuitry that prevents damage to the components, and allows for the orderly startup and shutdown of the hot-swappable component or peripheral.

One of the issues encountered in the design of hot-swappable components, e-fuses, and other protection integrated circuits is effectively dealing with the issue of inrush current. In many situations, the power supply bus of the hot-swappable component includes a very large amount of capacitance. When this high capacitance component is plugged into the system, a very large amount of current may flow in order to initially charge the large capacitance. In many hot-swappable systems, this inrush current is controlled by including a series element that provides resistance and/or controls the flow of current when the hot-swappable component is initially plugged into the system. Such a series element may be implemented for example using a power transistor such as a power MOSFET that is initially configured to have a high resistance during startup and then transitions to a much lower resistance during operation.

In order to deal with very large amounts of current power, MOSFETs that are used as series elements and hot-swappable components are generally very large in order to make sure that inrush currents do not exceed the power MOSFET's ability to handle currents. However, it is not uncommon for such power MOSFETs to fail in the field due to inrush currents being over the maximum amount that can be handled by the device, or fail due to the temperature of the device being over its thermal limit.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment of the techniques presented herein, a method of controlling current through a transistor is provided. The method includes measuring a voltage across the transistor. The method includes measuring a current through the transistor. The method includes determining a safe operating current from a safe operating area (SOA) profile for the voltage measured across the transistor. The method includes adjusting, for each of a first sequence of current pulses, a voltage of a voltage pulse applied to a control node of the transistor using a feedback controller until the current measured through the transistor is not greater than a first function of the safe operating current. The method includes adjusting, for each of a second sequence of current pulses after the first sequence of current pulses, the voltage of the voltage pulse applied to the control node of the transistor using the feedback controller until the current measured through the transistor is not greater than a second function of the safe operating.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Systems and methods are provided for controlling current through a transistor of a circuit, such as an inrush current through a hot-swappable circuit, an electronic fuse, a power supply circuit, or other system. The transistor may have a particular safe operating area profile with certain safe operating area limits (safe operating current limits) for certain situations. The safe operating area profile may specify safe operating current limits for current (Id) through the transistor, which may be based upon certain drain source voltages (Vds) of the transistor. For a particular drain source voltage (Vds), the transistor may safely operate up to a particular safe operating current limit for a certain timespan. If the current exceeds the safe operating current limit under such circumstances, then the transistor and circuit may become damaged such as due to high temperatures. For example, if a circuit has 50V input and there is 10 A current through the transistor, then there is 500 W of power dissipation over the transistor, which could damage the transistor. The safe operating area for some transistors, at higher drain source voltages (Vds), can be in the range of merely a few hundred or tens of milliamps. The current through the transistor is a function of a gate source voltage (Vgs) of the transistor. Accordingly, the gate source voltage (Vgs) can be controlled in order to keep the current through the transistor within a particular current limit so that the transistor is not damaged.

Using continuous gate source voltage (Vgs) control for regulating to such low currents (e.g., tens to hundreds of milliamps) requires very high accuracy and resolution, which complicates many integrated circuit implementations. Thus, continuous current control for certain integrated circuits (e.g., lower cost or smaller integrated circuits) may not be possible. In systems with large output/load capacitances (e.g., up to tens of mF), starting up a transistor with continuous gate source voltage (Vgs) control according to a DC safe operating area profile can result in transistor overstress and failure since the transistor could operate for a long time (e.g., hundreds of milliseconds up to tens of seconds) in linear mode with extensive power dissipation. Complex solutions include dual gate control that uses at least two transistors that are controlled with two gate drivers, which is complex, uses additional components, and is costly. Pulse width modulation control could be used, but requires external components to limit the transistor's current, and may not be applicable to hot-swappable components and e-fuses.

Systems and methods are provided for controlling the current through the transistor utilizing a pulsed gate control technique. The pulsed gate control technique allows the gate of the transistor to be turned on and off to average the current permitted through the transistor so that lower current levels can be achieved. The gate is pulsed on and off because the transistor can handle higher safe operation area current for short periods of time during the on time of a pulse. The off time between neighbor pulses is used to cool the transistor in order to lower a temperature of the transistor for a next pulse on time. As the drain source voltage (Vds) decreases the safe operation area current capability/limit increases. Thus, for a given pulse when there is a large drain source voltage (Vds), a current permitted is less than when the drain source voltage (Vds) is at a lower level. This pulsed gate control technique controls the current through the transistor by generating pulses to control the gate source voltage (Vgs), and thus the gate of the transistor, based upon measured drain source voltage (Vds) values over time. The current amplitude at which to regulate can be determined by comparing a measure current through the transistor to a preprogramed and calculated safe operating current, which is used to select a voltage to apply to the gate of the transistor during a particular pulse.

Figure 1:
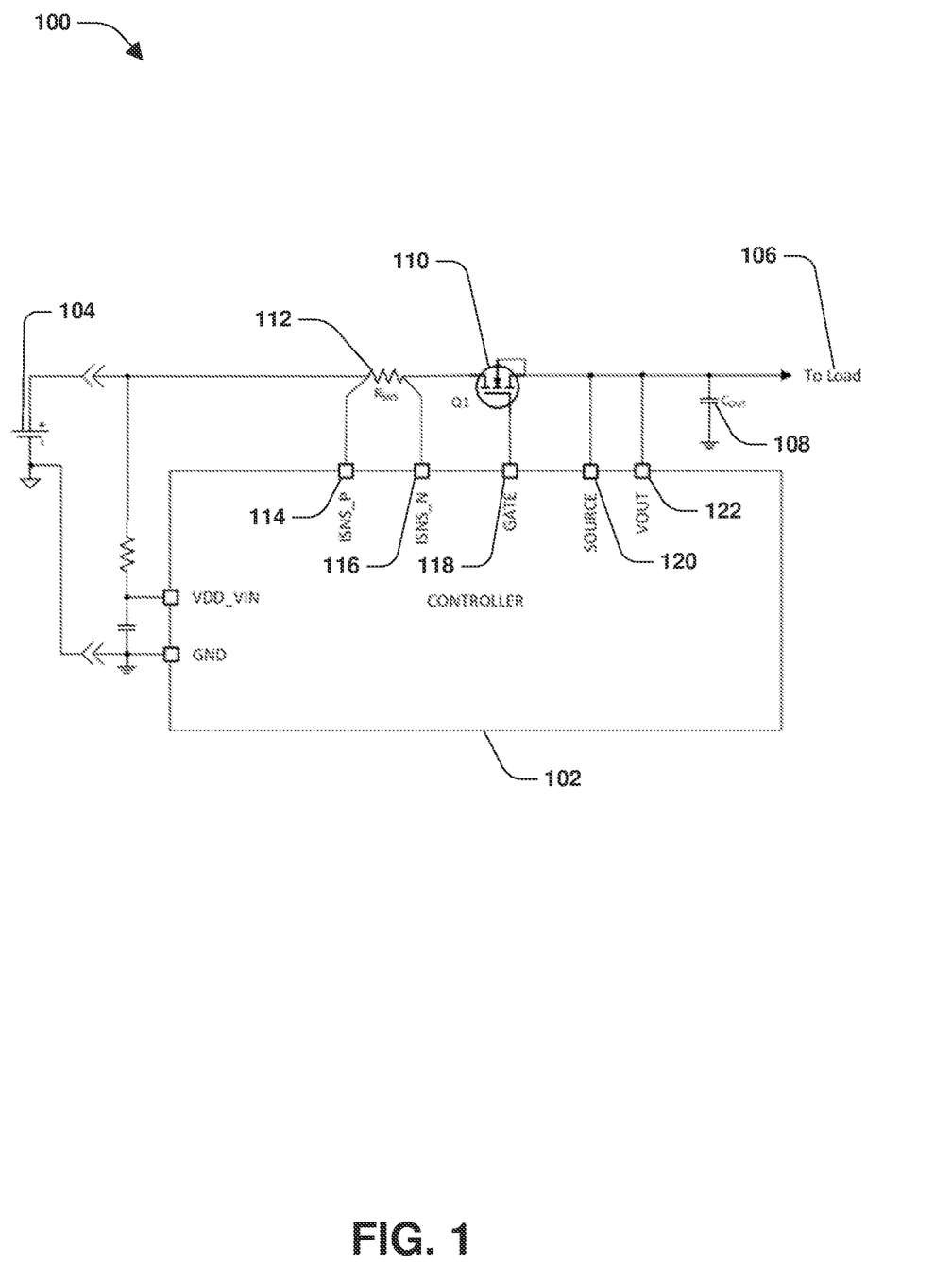
FIG. 1 is a component block diagram illustrating a circuit for controlling current through a transistor.

FIG. 1 illustrates a controller circuit 102 for controlling current through a transistor 110 of a circuit 100, such as an e-fuse, a hot-swappable circuit, or other integrated circuit. The circuit 100 may comprise a power source 104. The power source 104 may be connected to the transistor 110 through a sense resistor 112. The transistor 110 is also connected to an output capacitor 108 and/or a load 106. The controller circuit 102 is configured to monitor various conditions of the circuit 100 in order to control current through the transistor 110 utilizing a pulsed gate control technique that controls a gate of the transistor 110 through a gate connection 118. The controller circuit 102 may measure a current (Isns) through the sense resistor 112 using a first connection (ISNS_P) 114 and a second connection (ISNS_N) 116. The controller circuit 102 measures an output voltage (Vout) through a Vout connection 122. The controller circuit 102 measures a power source voltage through the first connection (ISNS_P) 114. Both voltages represent a drain source voltage (Vds) across the transistor 110.

The controller circuit 102 is configured to control the current through the transistor 110 to ensure that the transistor 110 does not overheat and/or become damaged from the amount of current through the transistor 110. The current through the transistor 110 is controlled by utilizing a pulsed gate control technique to operate the gate of the transistor 110 according to pulsed on and off sequences controlled by applying certain gate voltages to the gate of the transistor 110. The controller circuit 102 determines a pulse period and gate voltage that will ensure that a current through the transistor 110 is not greater than a safe operating current (a safe operating area current). The safe operating current is determined based upon a drain to source voltage (Vds) of the transistor 110 measured by the controller circuit 102. The safe operating current may be determined based upon the safe operating current being predefined or being calculated based upon the drain to source voltage (Vds). The controller determines a gate source voltage (Vgs) based upon the safe operating current and sensed/measured current through the transistor 110.

The gate source voltage (Vgs) is used to apply a gate voltage (Vg) to the gate of the transistor 110 during an on time of a pulse. During an off time after the on time, the transistor 110 is turned off in order to reduce a temperature of the transistor 110 so that the transistor is cooled off for a next on time of a next pulse. The transistor 110 is pulsed on and off with gate voltages (Vg) that control the amount of current through the transistor 110 in order to safely operate the transistor 110 without exceeding a safe operating current correspond to a particular drain to source voltage (Vds) and pulse period of an on time of a pulse. In this way, the controller circuit 102 utilizes the pulsed gate control technique to pulse the current through the transistor 110 in order to utilize higher safe current capabilities of the transistor with short pulses. Cool down times between pulses are used to keep the transistor 110 safe from overheat damage.

Figure 2:
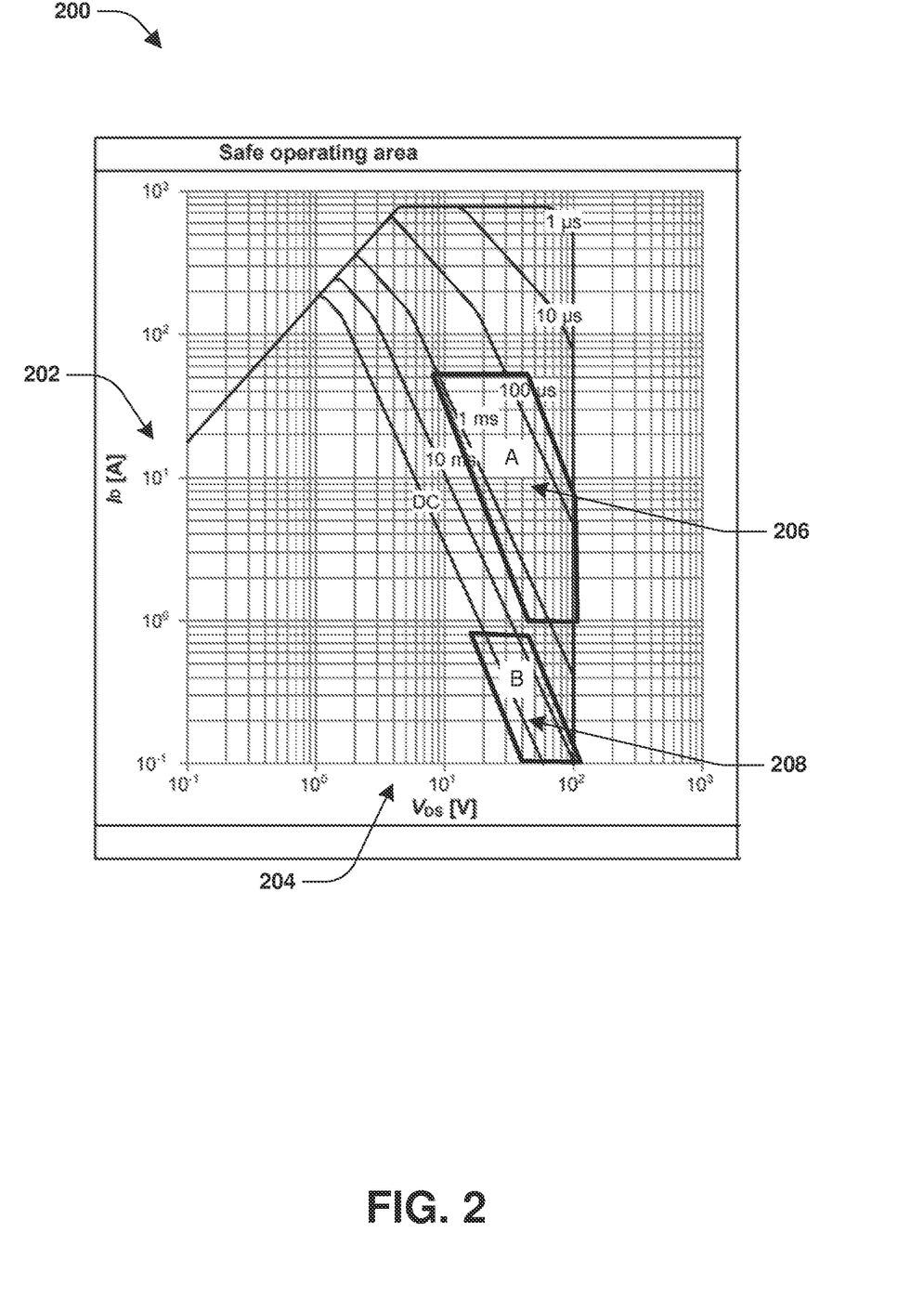
FIG. 2 is a graph illustrating a safe operating area chart for a transistor.

FIG. 2 is a graph 200 illustrating a safe operating area chart for a transistor. The graph 200 has an x-axis 204 representing drain source voltages (Vds) for a transistor. The graph 200 has a y-axis 202 representing safe operating current limits (Id) for the transistor. For a particular drain source voltage (Vds) across the transistor, the transistor can safely operate up to a particular safe operating current limit (Id) for a particular amount of time. The pulsed gate control technique can be used to control the transistor within various safe operation areas, such as a safe operating area (A) 206 and a safe operating area (B) 208. Without the pulsed gate control technique, the safe operating area (B) 208 would be too difficult to control using non-pulsed gate control techniques because of the low levels of current to monitor and achieve. With the pulsed gate control technique, higher safe operating currents can be achieved for short pulse durations with cool down periods in between pulses. In some embodiments, a pulse duration may have a value between about 100 μs and about 100 ms such as 100 μs, 1 ms, or 10 ms, or any other value. In some embodiments, for a particular drain source voltage (Vds) across the transistor and a pulse duration of 100 ms, then a safe operating current could be 10 A or larger. In some embodiments, if the drain source voltage (Vds) is 80V, then the safe operating current could be 1 A. In some embodiments, if the drain source voltage (Vds) is 40V, then the safe operating current could be 10 A.

Figure 3:
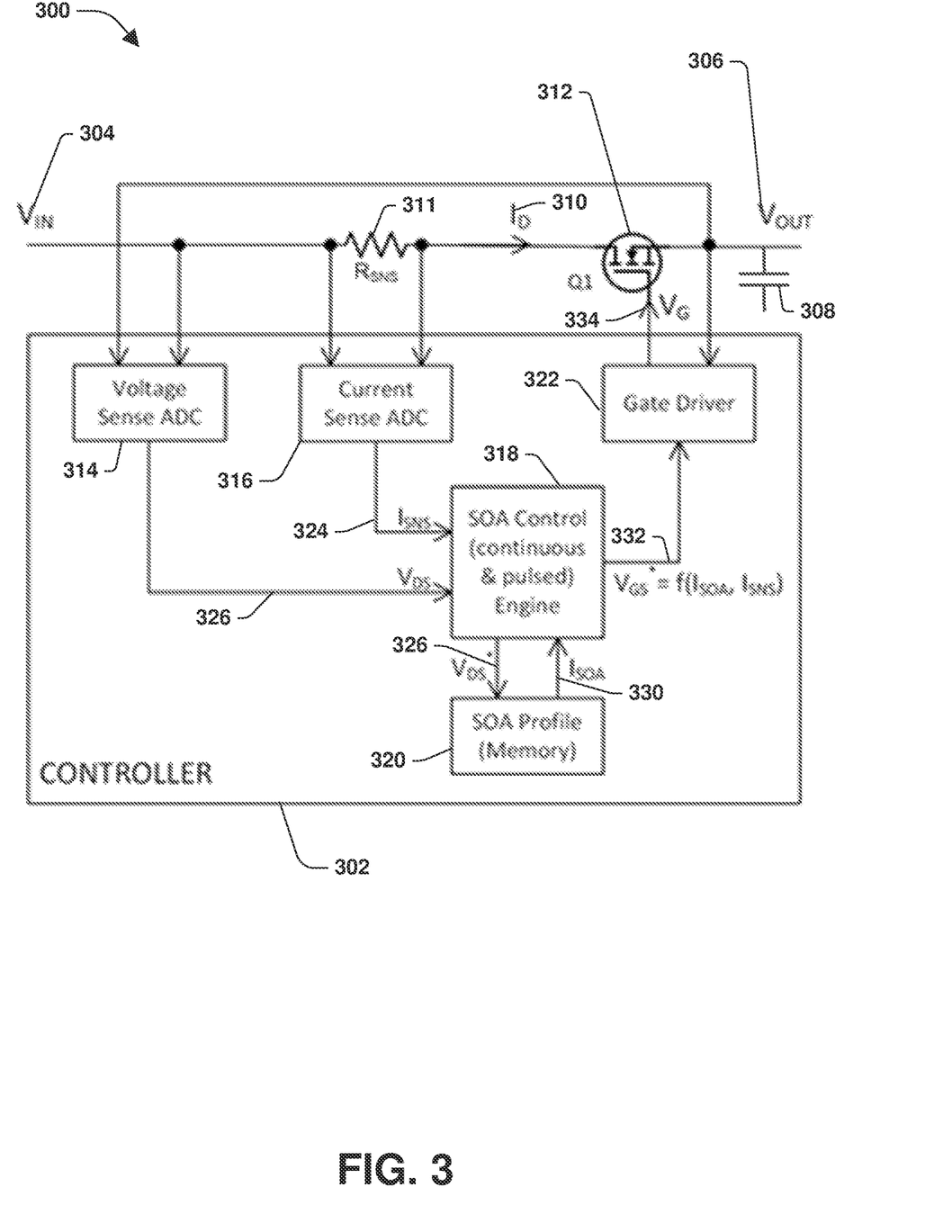
FIG. 3 is a component block diagram illustrating a circuit for controlling current through a transistor.

FIG. 3 is a component block diagram illustrating a circuit 300 for controlling current through a transistor 312. The circuit 300 may correspond to an e-fuse, a hot-swappable circuit, or other integrated circuit. The circuit 300 has an input voltage (Vin) 304. The input voltage (Vin) 304 creates a current (Id) 310 (Id) that flows through the transistor 312. The current (Id) 310 travels through a sense resistor 311 of the circuit 300 before reaching the transistor 312. The transistor 312 is connected to an output capacitor 308 that is charged by the current (Id) 310 flowing through the transistor 312 towards the output capacitor 308. In some embodiments, the output capacitor 308 may be charged into the range of a few hundred microfarads up to 10 to 20 millifarads. The circuit 300 has an output voltage 306 (Vout), such as where the transistor 312 is connected to a load powered by the output voltage 306 (Vout).

A controller circuit 302 may be configured to indirectly control the current (Id) 310 through the transistor 312 (e.g., pulsing amplitude of the current (Id) 310) by applying a gate voltage (Vg) 334 to the transistor 312 using a gate driver 322 controlled by a safe operating area control engine 318. The gate driver 322 controls the gate voltage (Vg) 334 over time in order to turn the transistor 312 on and off during a series of pulses. The gate voltage (Vg) 334 is controlled based upon various measurements obtained by the controller circuit 302. In particular, the controller circuit 302 comprises a voltage measurement circuit 314 configured to measure a voltage across the transistor 312, such as a drain to source voltage (Vds) 326. The controller circuit 302 comprises a current measurement circuit 316 configured to measure a current (Isns) 324 through the sense resistor 311. In some embodiments, the measured current (Isns) 324 may correspond to the current (Id) 310 through the transistor 312. The drain to source voltage (Vds) 326 corresponding to the voltage across the transistor 312 and the current (Isns) 324 corresponding to the current through the transistor 312 are input into the safe operating area control engine 318.

The safe operating area control engine 318 utilizes the drain to source voltage (Vds) 326 to determine a safe operating current (Isoa) 330 for the transistor 312 at that particular drain to source voltage (Vds) 326. The safe operating current (Isoa) 330 may correspond to a current limit for the transistor 312 such that the transistor 312 can safely handle a current within the current limit for the particular drain to source voltage (Vds) 326 over a time period of an on time used to pulse the transistor 312 into an on state where the current (Id) 310 flows through the transistor 312. In some embodiments, the safe operating current (Isoa) 330 may be calculated based upon the drain to source voltage (Vds) 326. In some embodiments, the safe operating current (Isoa) 330 may be identified by performing a lookup into a lookup table maintained within memory 320 as a safe operating area profile. The lookup table may include entries of safe operating continuous current values (safe operating currents) corresponding to measured voltage values (drain to source voltages (Vds)) for continuous current conditions. The lookup table may include entries of safe operating pulsed current values (safe operating currents) corresponding to measured voltage values (drain to source voltages (Vds)) for pulsed current conditions. The safe operating area control engine 318 may utilize the drain to source voltage (Vds) 326 to perform a lookup in to the lookup table in the memory 320 in order to identify a corresponding entry populated with the safe operating current (Isoa) 330 for that drain to source voltage (Vds) 326.

Using the safe operating current (Isoa) 330, the safe operating area control engine 318 determines a gate source voltage (Vgs) 332 as a function of the safe operating current (Isoa) 330 and the current (Isns) 324 measured by the current measurement circuit 316. The gate source voltage (Vgs) 332 is used by the gate driver 322 to apply a particular gate voltage (Vg) 334 to the gate of the transistor 312 during an on time of a pulse. The time of performing the pulse may be based upon a pulse period that may be set to a particular value (e.g., a pulse period between about 100 µs to about 100 ms). Once the pulse period ends, the gate driver 322 stops applying the gate voltage (Vg) 334 to the gate of the transistor 312 in order to turn off and cool the transistor 312 since no current will flow through the transistor 312. While the transistor 312 is on, the output capacitor 308 is charged by the current (Id) 310 flowing through the transistor 312. The safe operating area control engine 318 calculates the gate source voltage (Vgs) 332 in a manner to ensure that a current level of a pulse is kept stable and is regulated for a period of time such as a 1 ms pulse period, in some embodiments.

A series of pulse sequences may be performed to apply different gate voltage (Vg) 334 values to the gate of the transistor 312 during on times of pulses based upon drain to source voltage (Vds) 326 measured values, current (Isns) 324 measured values, and safe operating current (Isoa) 330 values corresponding to the drain to source voltage (Vds) 326 measured values in order to pulse the amplitude of current through the transistor 312 over time. A duty cycle (e.g., 2%, 5%, 10%, 20%, etc.) may be configured based upon the transistor's safe operating area capabilities. In some embodiments, the current (Id) 310 through the transistor 312 may be pulsed from 0A to 127.5 A with 0.5 A pulse steps for each drain to source voltage (Vds) 326 measurement. As drain to source voltage (Vds) 326 measured values decreases over time, larger current (Id) 310 is allowed over time during each on time of the series of pulse sequences. Because the transistor 312 is operated within a safe operating area of the transistor 312 using pulses derived from safe operating current values, temperature increase of the transistor 312 is limited without having to measure the temperature of the transistor 312. In some embodiments, a safe operating current may be 1 A. Accordingly, the safe operating area control engine 318 generates a series of increasing gate voltage (Vg) 334 values until current (Isns) 324 (current (Id) 310) reaches 1A, and then a fixed gate voltage (Vg) 334 value is used for controlling the gate of the transistor 312.

In some embodiments, a first sequence of current pulses of the current (Id) 310 are generated through the transistor 312. For each of the current pulses, a value of the gate voltage (Vg) 334 of a voltage pulse applied to a control node (e.g., the gate) of the transistor 312 is adjusted until the current (Isns) 324 measured through the transistor 312 is no greater than a first function of the safe operating current (Isoa) 330. A second sequence of current pulses of the current (Id) 310 are performed after the first sequence of current pulses. For each of the current pulses of the second sequence of current pulses, the value of the gate voltage (Vg) 334 of the voltage pulse applied to the control node (e.g., the gate) of the transistor 312 is adjusted until the current (Isns) 324 measured through the transistor 312 is no greater than a second function of the safe operating current (Isoa) 330. In some embodiments, the first function of the safe operating current is greater than a DC safe operating current from a safe operating area profile stored within the memory 320 for the particular drain to source voltage (Vds) 326 measured across the transistor 312. In some embodiments, the second function is greater than the first function, such as where the second function is a multiplication factor of the first function (e.g., a multiplication factor of 4). In some embodiments, the second sequence of current pulses is initiated when the current (Isns) 324 measured through the transistor 312 reaches a threshold, such as a threshold of 0.5 A. In this way, the current (Id) 310 is pulsed through the transistor 312 in a manner that operates the transistor 312 in a safe manner without being damaged from too high of operating temperatures.

Figure 4:
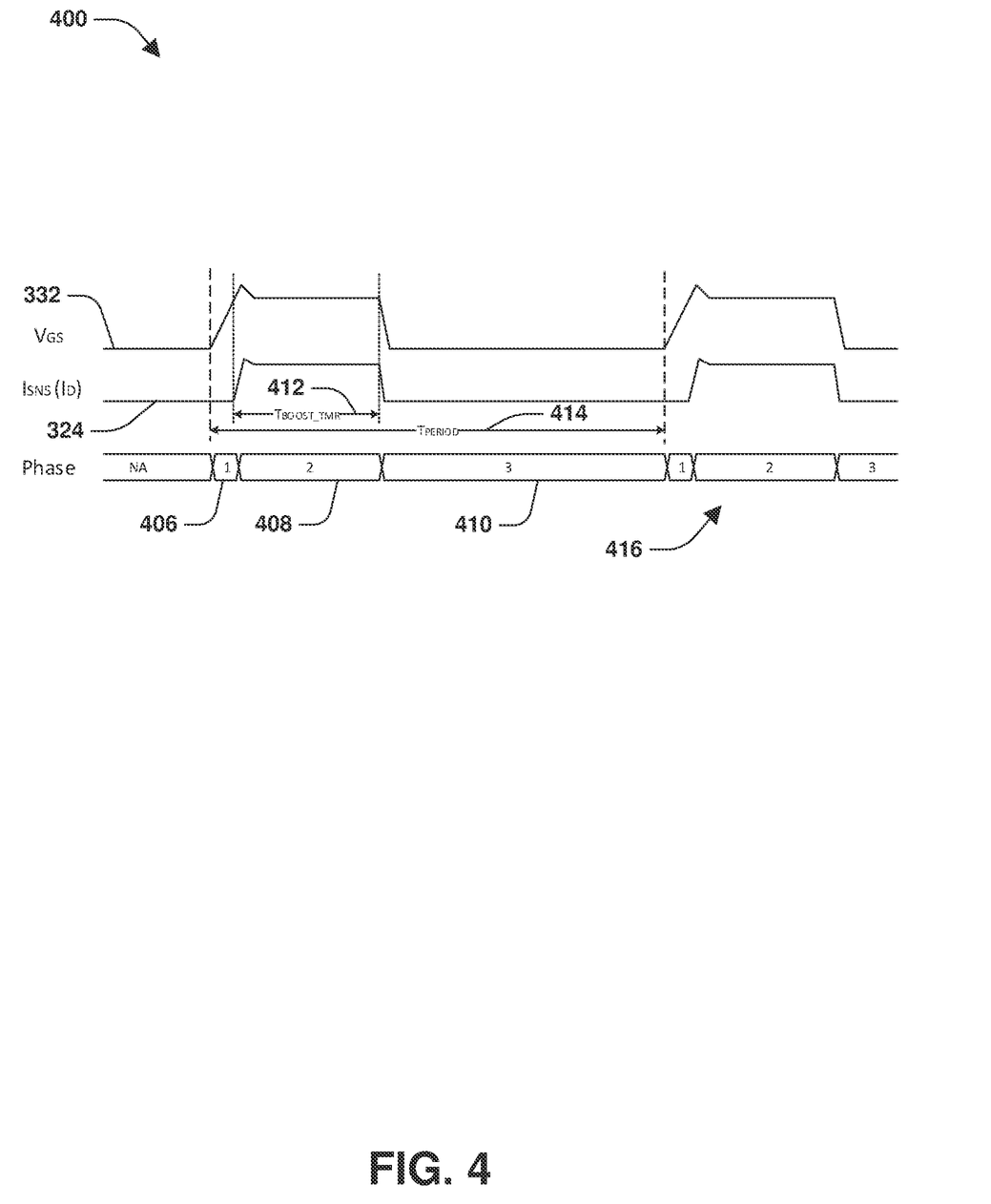
FIG. 4 is a waveform associated with operation of a circuit controlling current through a transistor

FIG. 4 is a waveform 400 associated with operation of a circuit controlling current through a transistor, which is described in association with FIG. 3. The waveform 400 includes values of the gate source voltage (Vgs) 332 that is used by the gate driver 322 to apply a particular gate voltage (Vg) 334 to the gate of the transistor 312. The waveform 400 includes values of a current (Isns) 324 measured and corresponding to a current (Id) 310 through the transistor 312 over time. The transistor 312 is controlled through pulse sequences, wherein a pulse sequence includes a first phase 406, a second phase 408, and a third phase 410. Before a startup pulse sequence is performed, the output capacitor 308 connected to the transistor 312 is discharged so that the drain to source voltage (Vds) 326 measured across the transistor 312 is equal to the input voltage (Vin) 304 (e.g., 75V or some other value)

During the first phase 406, the gate source voltage (Vgs) 332 starts to increase. A pulse time period 414, defined by a boost mode timer period 412 of a pulse timer and a boost mode DC value, actives the increase of the gate source voltage (Vgs) 332. During the second phase 408, the pulse timer, set to the boost mode timer period 412, starts after the increase (ramp up) of the gate source voltage (Vgs) 332 has completed once current flow through the transistor 312 is detected (e.g., current (Isns) 324>0A). A current target for the transistor 312 is set to boost. If the safe operating current (Isoa) 330 corresponding to the measured drain to source voltage (Vds) 326 is greater than 0, then Iboost is set to be 4× the safe operating current (Isoa) 330. If the safe operating current (Isoa) 330 is 0, then Iboost is set to 0.5 A and is controlled/regulated at the set level. During the third phase 410 after the pulse timer, set to the boost mode timer period 412, has expired, the transistor 312 is turned off to set the current (Id) 310 through the transistor 312 to 0A so that the transistor 312 can cool off until a next pulse sequence 416.

After pulse time period 414 has expired, a next pulse sequence is performed where the gate source voltage (Vgs) 332 is increased (ramped up) and continues from the prior pulse sequence until the target safe operating current (Isoa) 330 is equal to or greater than 1.5 A. Once the safe operating current (Isoa) 330 is equal to or greater than 1.5 A, continuous gate control is performed using normal safe operating current (Isoa) 330 target values.

In some embodiments, the boost mode timer period 412 defines a pulse width with settings between about 100 μs and 1 ms and the boost mode DC value defines a duty cycle with settings such as 2%, 5%, 10%, and 20%, which may be configured according to safe operating area capabilities of the transistor 312. The specific safe operating area limits (safe operating current (Isoa) 330 being a function of drain to source voltage (Vds) 326) are used for each transistor to be programming within a controller integrated circuit, such as where a particular transistor allows for safe operating area programming between 0A and 127.5 A with 0.5 A steps for every volt of drain to source voltage (Vds) 326. The techniques described herein can be applied to a wide range of pulse widths, duty cycles, and amplitudes of currents within pulses.

In some embodiments, a pulse sequence includes a first stage, a second stage, and a third stage. During the first stage, pulsed gate control begins where current (Id) 310 controlled by a pulse is regulated to a minimum level of a threshold (e.g., 0.5 A where the programmed DC safe operating area is less than 0.5 A such as 95 mA at the particular source voltage (Vds) 326 at this time). In some embodiments, the boost mode timer period 412 may be set to 1 ms and the boost mode DC value may be set to 10%, and thus the pulse time period 414 may be 1 ms/10%=10 ms. In some embodiments, the second stage starts as soon as the drain to source voltage (Vds) 326 reaches a voltage where the programmed DC safe operating area current is 0.5 A, which may be around 32V, in some embodiments. During the second stage, the pulsed current (Id) 310 through the transistor 312 is regulated to 4*0.5A=2A. The third stage occurs once the programmed DC safe operating area current reaches 1A, which may correspond to where the drain to source voltage (Vds) 326 is 23V, in some embodiments. During the third phase 410, the pulsed current may be regulated to 4*1A=4A.

In some embodiments, pulsing continues until the programmed DC safe operating area current is greater than or equal of 1.5 A, which may occur when the drain to source voltage (Vds) 326 is 18V, in some embodiments. When this point is reached, pulsing is stopped and the output capacitor 308 is charged by means of continuous safe operating area control based upon a preprogrammed DC safe operating area profile and the transistor 312 will be fully enhanced.

In some embodiments, the input voltage (Vin) 304 is 75V, the output capacitor 308 is 10 mF, the sense resistor 311 is 2.5 mΩ, a programmed max voltage drop over the sense resistor 311 for over current (OC) detection (Vsns_cs) may be 12.5 mV, an OC level (Vsns_cs/Rsns) is 12.5 mV/2.5 mΩ=5A, the boost mode DC value is 10%, and the boost mode timer period 412 is 1 ms.

Figure 5:
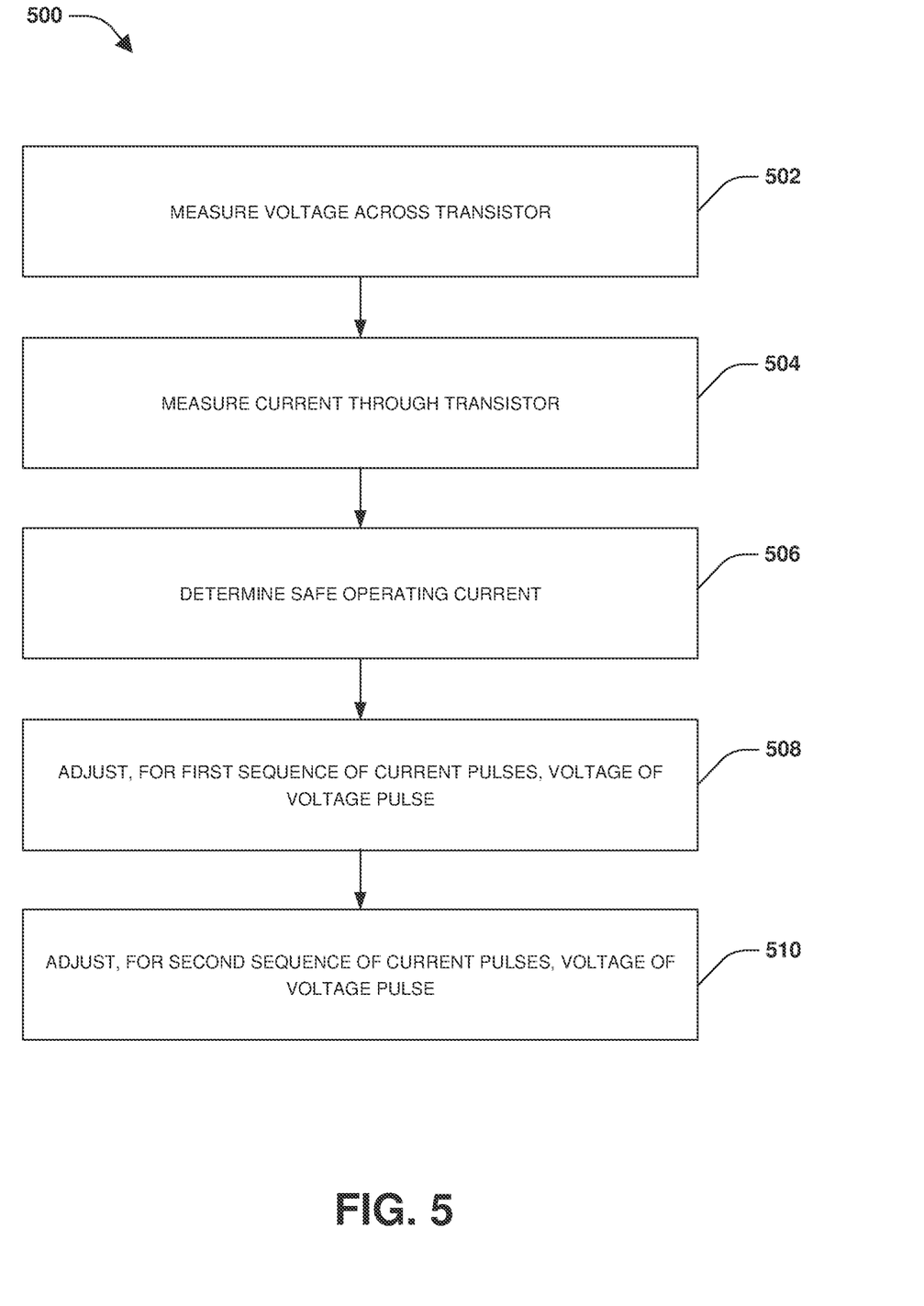
FIG. 5 is an illustration of an example method of controlling current through a transistor.

FIG. 5 is an illustration of an example method 500 of controlling current through a transistor. The method 500 may be implemented for a hot-swappable circuit to operate a transistor (e.g., a series transistor) and a capacitor coupled to a first load path terminal of the transistor. A second load path terminal of the transistor is coupled to a power supply. The capacitor of the transistor is charged by performing one or more sequences of current pulses. In particular, during operation 502 of method 500, a voltage across the transistor is measured. During operation 504 of method 500, a current through the transistor is measured. During operation 506 of method 500, a safe operating current is determined for the voltage measured across the transistor. In some embodiments, the safe operating current is determined from a safe operating area profile for the voltage. In some embodiments, the safe operating area profile includes a first zone of safe current values for the voltage measured across the transistor (e.g., safe operating area (B) 208) and a second zone of safe current values (e.g., safe operating area (A) 206), greater than the first zone, for the voltage measured across the transistor. The safe operating current may be determined from the second zone, in some embodiments.

During operation 508 of method 500, a first sequence of current pulses is performed. For each current pulse, a voltage applied to a control node of the transistor (e.g., a gate voltage applied to a gate of the transistor) is adjusted using a feedback controller (e.g., controller circuit 302) until the current measured through the transistor is not greater than a first function of the safe operating current. In some embodiments, the first function is greater than a DC safe operating current from the safe operating area profile for the voltage measured across the transistor. In some embodiments, the first function is a DC safe operating current from the safe operating area profile for the voltage measured across the transistor when the DC safe operating current is at or above a threshold (e.g., 0.5 A). In some embodiments, the first function is a fixed safe operating current greater than the DC safe operating current from the safe operating area profile for the voltage measured across the transistor when the DC safe operating current is below the threshold. In some embodiments, each of the current pulses is applied with a first duty cycle. In some embodiments, the adjustment of the voltages of the voltage pulses for each current pulse of the first sequence includes applying the voltage to the control node for a first time period (an on time) that turns on the transistor and de-applying the voltage to the control node for a second time period (an off time) after the first time period to turn off the transistor.

During operation 510 of method 500, a second sequence of current pulses is performed. In some embodiments, the second sequence of current pulses is initiated when the current measured through the transistor reaches a first threshold. For each current pulse, the voltage applied to the control node of the transistor is adjusted using the feedback controller until the current measured through the transistor is not greater than a second function of the safe operating current. In some embodiments, the second function of the safe operating current is greater than the first function of the safe operating current. In some embodiments, the second function is a multiplication factor of the first function. In some embodiments, the multiplication factor is 4 or some other value. In some embodiments, the multiplication factor is determined to have a value within a safe operating area for a select pulse length (e.g., a multiplication factor of ×4 for 1 ms; a multiplication factor of ×64 for 100 μs; etc.). In some embodiments, the adjustment of the voltages of the voltage pulses for each current pulse of the second sequence includes applying the voltage to the control node for the first time period (the on time) that turns on the transistor and de-applying the voltage to the control node for the second time period (the off time) after the first time period to turn off the transistor. In some embodiments, each of the current pulses of the second sequence are applied with a second duty cycle different than the first duty cycle of the first sequence of current pulses.

In some embodiments, a third sequence of current pulses is performed after the second sequence of current pulses. In some embodiments, the second sequence of current pulses is initiated when the current measured through the transistor reaches a second threshold greater than the first threshold that triggered the second sequence of current pulses. For each current pulse, the voltage applied to the control node of the transistor is adjusted using the feedback controller until the current measured through the transistor is not greater than a third function of the safe operating current. In this way, any number of sequences of current pulses can be performed.

After performing the sequences of current pulses, a continuous voltage is applied to the control node of the transistor until the current measured through the transistor is not greater than a DC safe operating current for the voltage measured across the transistor.

Figure 6:
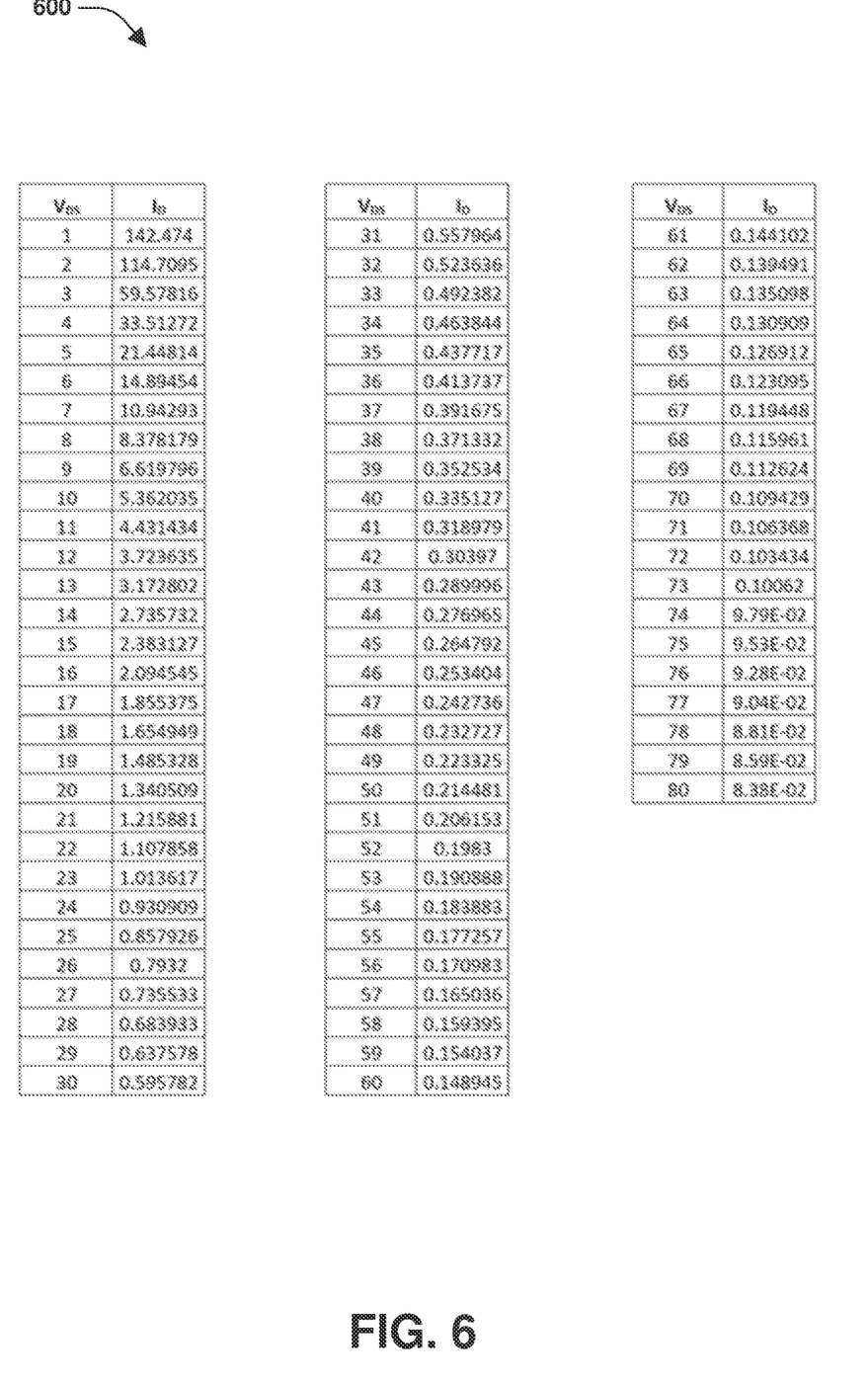
FIG. 6 is an example of a safe operating area profile for a transistor.

FIG. 6 is an example of a safe operating area profile 600 for a transistor. The safe operating area profile 600 may be stored within the memory 320 of the controller circuit 302 as a lookup table. In this way, measured drain source voltage (Vds) 326 values can be used to query the lookup table to identify a corresponding current (Id) as a safe operating area current (Isoa) used to determine how to control the gate of the transistor 312.

According to some embodiments, a method of controlling current through a transistor is provided. The method includes measuring a voltage across the transistor; measuring a current through the transistor; determining a safe operating current from a safe operating area (SOA) profile for the voltage measured across the transistor; adjusting, for each of a first sequence of current pulses, a voltage of a voltage pulse applied to a control node of the transistor using a feedback controller until the current measured through the transistor is not greater than a first function of the safe operating current; and adjusting, for each of a second sequence of current pulses after the first sequence of current pulses, the voltage of the voltage pulse applied to the control node of the transistor using the feedback controller until the current measured through the transistor is not greater than a second function of the safe operating.

According to some embodiments, the first function of the safe operating current is greater than a DC safe operating current from the SOA profile for the voltage measured across the transistor.

According to some embodiments, the second function of the safe operating current is greater than the first function of the safe operating current.

According to some embodiments, the first function is at least one of: a DC safe operating current from the SOA profile for the voltage measured across the transistor when the DC safe operating current is at or above a threshold; or a fixed safe operating current greater than the DC safe operating current from the SOA profile for the voltage measured across the transistor when the DC safe operating current is below the threshold.

According to some embodiments, at least one of the threshold is 0.5 amperes or the fixed safe operating current is 0.5 amperes.

According to some embodiments, the second function is a multiplication factor of the first function.

According to some embodiments, the multiplication factor is determined to have a value within a safe operating area for a select pulse length.

According to some embodiments, the second sequence of current pulses is initiated when the current measured through the transistor reaches a threshold.

According to some embodiments, the method includes adjusting, for each of a third sequence of current pulses after the second sequence of current pulses, the voltage of the voltage pulse applied to the control node of the transistor using the feedback controller until the current measured through the transistor is not greater than a third function of the safe operating current.

According to some embodiments, the second sequence of current pulses is initiated when the current measured through the transistor reaches a first threshold, and the third sequence of current pulses is initiated after the second sequence of current pulses when the current measured through the transistor reaches a second threshold greater than the first threshold.

According to some embodiments, the SOA profile includes a first zone of safe current values for the voltage measured across the transistor and a second zone of safe current values, greater than the first zone, for the voltage measured across the transistor, and determining the safe operating current from the SOA profile includes: determining the safe operating current from the second zone.

According to some embodiments, adjusting the voltage of the voltage pulse for each of the first sequence of current pulses, includes: applying the voltage to the control node for a first time period that turns the transistor on; and de-applying the voltage to the control node for a second time period, after the first time period, to turn the transistor off; and adjusting the voltage of the voltage pulse for each of the second sequence of current pulses, includes: applying the voltage to the control node for the first time period that turns the transistor on; and de-applying the voltage to the control node for the second time period, after the first time period, to turn the transistor off.

According to some embodiments, each of the first sequence of current pulses is applied with a first duty cycle, and each of the second sequence of current pulses is applied with a second duty cycle different than the first duty cycle.

According to some embodiments, the method includes applying a continuous voltage to the control node of the transistor, after the second sequence of current pulses, using the feedback controller until the current measured through the transistor is not greater than a DC safe operating current from the SOA profile for the voltage measured across the transistor.

According to some embodiments, an apparatus is provided. The apparatus includes means for measuring a voltage across the transistor; means for measuring a current through the transistor; means for determining a safe operating current from a safe operating area (SOA) profile for the voltage measured across the transistor; means for adjusting, for each of a first sequence of current pulses, a voltage of a voltage pulse applied to a control node of the transistor using a feedback controller until the current measured through the transistor is not greater than a first function of the safe operating current; and means for adjusting, for each of a second sequence of current pulses after the first sequence of current pulses, the voltage of the voltage pulse applied to the control node of the transistor using the feedback controller until the current measured through the transistor is not greater than a second function of the safe operating.

According to some embodiments, a circuit for controlling current through a transistor is provided. The circuit includes a voltage measurement circuit configured to measure a voltage across the transistor; a current measurement circuit configured to measure a current through the transistor; and a controller circuit configured to: determine a safe operating current based on the voltage measured across the transistor; adjust, for each of a first sequence of current pulses, a voltage of a voltage pulse applied to a control node of the transistor until the current measured through the transistor is not greater than a first function of the safe operating current; and adjust, for each of a second sequence of current pulses after the first sequence of current pulses, the voltage of the voltage pulse applied to the control node of the transistor until the current measured through the transistor is not greater than a second function of the safe operating current.

According to some embodiments, the controller circuit includes a lookup table of: entries of safe operating continuous current values corresponding to measured voltage values for continuous current conditions, and entries of safe operating pulsed current values corresponding to measured voltage values for pulsed current conditions, and the controller circuit is configured to determine the safe operating current from at least one of the entries of safe operating continuous current values or the entries of safe operating pulsed current values.

According to some embodiments, the controller circuit is configured to limit a temperature increase of the transistor based on entries of safe operating current values within the lookup table without measurement of the temperature of the transistor.

According to some embodiments, the circuit includes a capacitor coupled to the transistor, wherein the controller is configured to: activate the transistor to charge the capacitor, and activate the transistor to discharge the capacitor.

According to some embodiments, a method of operating a hot-swappable circuit including a series transistor and a capacitor coupled to a first load path terminal of the series transistor is provided. The method includes connecting a second load path terminal of the series transistor to a power supply; and charging the capacitor via the series transistor, charging the capacitor including: measuring a voltage across the series transistor; measuring a current through the series transistor; determining a safe operating current for the voltage measured across the transistor; adjusting, for each of a first sequence of current pulses, a voltage of a voltage pulse applied to a control node of the transistor until the current measured through the transistor is not greater than a first function of the safe operating current; adjusting, for each of a second sequence of current pulses after the first sequence of current pulses, the voltage of the voltage pulse applied to the control node of the transistor until the current measured through the transistor is not greater than a second function of the safe operating current; and applying a continuous voltage to the control node of the transistor, after the second sequence of current pulses, until the current measured through the transistor is not greater than a DC safe operating current for the voltage measured across the transistor.

According to some embodiments, the method includes adjusting, for each of a third sequence of current pulses after the second sequence of current pulses, the voltage of the voltage pulse applied to the control node of the transistor until the current measured through the transistor is not greater than a third function of the safe operating current, wherein the second sequence of current pulses is initiated when the current measured through the transistor reaches a first threshold, and the third sequence of current pulses is initiated when the current measured through the transistor reaches a second threshold greater than the first threshold.

According to some embodiments, an apparatus is provided. The apparatus means for connecting a second load path terminal of the series transistor to a power supply; and means for charging the capacitor via the series transistor, charging the capacitor including: measuring a voltage across the series transistor; measuring a current through the series transistor; determining a safe operating current for the voltage measured across the transistor; adjusting, for each of a first sequence of current pulses, a voltage of a voltage pulse applied to a control node of the transistor until the current measured through the transistor is not greater than a first function of the safe operating current; adjusting, for each of a second sequence of current pulses after the first sequence of current pulses, the voltage of the voltage pulse applied to the control node of the transistor until the current measured through the transistor is not greater than a second function of the safe operating current; and applying a continuous voltage to the control node of the transistor, after the second sequence of current pulses, until the current measured through the transistor is not greater than a DC safe operating current for the voltage measured across the transistor.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of controlling current through a transistor, the method comprising:
   measuring a voltage across the transistor;
   measuring a current through the transistor;
   determining a safe operating current from a safe operating area (SOA) profile for the voltage measured across the transistor;
   adjusting, for each of a first sequence of current pulses, a voltage of a voltage pulse applied to a control node of the transistor using a feedback controller until the current measured through the transistor is not greater than a first function of the safe operating current; and
   adjusting, for each of a second sequence of current pulses after the first sequence of current pulses, the voltage of the voltage pulse applied to the control node of the transistor using the feedback controller until the current measured through the transistor is not greater than a second function of the safe operating current.

2. The method of claim 1, wherein the first function of the safe operating current is greater than a DC safe operating current from the SOA profile for the voltage measured across the transistor.

3. The method of claim 1, wherein the second function of the safe operating current is greater than the first function of the safe operating current.

4. The method of claim 1, wherein the first function is at least one of:
   a DC safe operating current from the SOA profile for the voltage measured across the transistor when the DC safe operating current is at or above a threshold; or
   a fixed safe operating current greater than the DC safe operating current from the SOA profile for the voltage measured across the transistor when the DC safe operating current is below the threshold.

5. The method of claim 4, wherein at least one of the threshold is 0.5 amperes or the fixed safe operating current is 0.5 amperes.

6. The method of claim 1, wherein the second function is a multiplication factor of the first function.

7. The method of claim 6, wherein the multiplication factor is determined to have a value within a safe operating area for a select pulse length.

8. The method of claim 1, wherein the second sequence of current pulses is initiated when the current measured through the transistor reaches a threshold.

9. The method of claim 1, comprising:
adjusting, for each of a third sequence of current pulses after the second sequence of current pulses, the voltage of the voltage pulse applied to the control node of the transistor using the feedback controller until the current measured through the transistor is not greater than a third function of the safe operating current.

10. The method of claim 9, wherein:
the second sequence of current pulses is initiated when the current measured through the transistor reaches a first threshold, and
the third sequence of current pulses is initiated after the second sequence of current pulses when the current measured through the transistor reaches a second threshold greater than the first threshold.

11. The method of claim 1, wherein:
the SOA profile includes a first zone of safe current values for the voltage measured across the transistor and a second zone of safe current values, greater than the first zone, for the voltage measured across the transistor, and
determining the safe operating current from the SOA profile comprises:
determining the safe operating current from the second zone.

12. The method of claim 1, wherein:
adjusting the voltage of the voltage pulse for each of the first sequence of current pulses, comprises:
applying the voltage to the control node for a first time period that turns the transistor on; and
de-applying the voltage to the control node for a second time period, after the first time period, to turn the transistor off; and
adjusting the voltage of the voltage pulse for each of the second sequence of current pulses, comprises:
applying the voltage to the control node for the first time period that turns the transistor on; and
de-applying the voltage to the control node for the second time period, after the first time period, to turn the transistor off.

13. The method of claim 1, wherein:
each of the first sequence of current pulses is applied with a first duty cycle, and
each of the second sequence of current pulses is applied with a second duty cycle different than the first duty cycle.

14. The method of claim 1, comprising:
applying a continuous voltage to the control node of the transistor, after the second sequence of current pulses, using the feedback controller until the current measured through the transistor is not greater than a DC safe operating current from the SOA profile for the voltage measured across the transistor.

15. A circuit for controlling current through a transistor, the circuit comprising:
a voltage measurement circuit configured to measure a voltage across the transistor;
a current measurement circuit configured to measure a current through the transistor; and
a controller circuit configured to:
determine a safe operating current based on the voltage measured across the transistor;
adjust, for each of a first sequence of current pulses, a voltage of a voltage pulse applied to a control node of the transistor until the current measured through the transistor is not greater than a first function of the safe operating current; and
adjust, for each of a second sequence of current pulses after the first sequence of current pulses, the voltage of the voltage pulse applied to the control node of the transistor until the current measured through the transistor is not greater than a second function of the safe operating current.

16. The circuit of claim 15, wherein:
the controller circuit comprises a lookup table of:
entries of safe operating continuous current values corresponding to measured voltage values for continuous current conditions, and
entries of safe operating pulsed current values corresponding to measured voltage values for pulsed current conditions, and
the controller circuit is configured to determine the safe operating current from at least one of the entries of safe operating continuous current values or the entries of safe operating pulsed current values.

17. The circuit of claim 16, wherein the controller circuit is configured to limit a temperature increase of the transistor based on entries of safe operating current values within the lookup table without measurement of the temperature of the transistor.

18. The circuit of claim 15, comprising:
a capacitor coupled to the transistor, wherein the controller is configured to:
activate the transistor to charge the capacitor, and
activate the transistor to discharge the capacitor.

19. A method of operating a hot-swappable circuit comprising a series transistor and a capacitor coupled to a first load path terminal of the series transistor, the method comprising:
connecting a second load path terminal of the series transistor to a power supply; and
charging the capacitor via the series transistor, charging the capacitor comprising:
measuring a voltage across the series transistor;
measuring a current through the series transistor;
determining a safe operating current for the voltage measured across the series transistor;
adjusting, for each of a first sequence of current pulses, a voltage of a voltage pulse applied to a control node of the series transistor until the current measured through the series transistor is not greater than a first function of the safe operating current;
adjusting, for each of a second sequence of current pulses after the first sequence of current pulses, the voltage of the voltage pulse applied to the control node of the series transistor until the current measured through the series transistor is not greater than a second function of the safe operating current; and
applying a continuous voltage to the control node of the series transistor, after the second sequence of current pulses, until the current measured through the series transistor is not greater than a DC safe operating current for the voltage measured across the series transistor.

20. The method of claim 19, comprising:
adjusting, for each of a third sequence of current pulses after the second sequence of current pulses, the voltage of the voltage pulse applied to the control node of the series transistor until the current measured through the series transistor is not greater than a third function of the safe operating current, wherein
the second sequence of current pulses is initiated when the current measured through the series transistor reaches a first threshold, and the third sequence of current pulses is initiated when the current measured through the series transistor reaches a second threshold greater than the first threshold.

* * * * *